US008410802B2

(12) United States Patent
Gupta et al.

(10) Patent No.: US 8,410,802 B2
(45) Date of Patent: Apr. 2, 2013

(54) SYSTEM INCLUDING THERMAL CONTROL UNIT HAVING CONDUIT FOR DISPENSE AND REMOVAL OF LIQUID THERMAL INTERFACE MATERIAL

(75) Inventors: Ashish Gupta, Chandler, AZ (US); James R. Hastings, Chandler, AZ (US); Nader N. Abazarnia, Chandler, AZ (US); Suzana Prstic, Chandler, AZ (US); Jerome L. Garcia, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 412 days.

(21) Appl. No.: 12/647,261

(22) Filed: Dec. 24, 2009

(65) Prior Publication Data
US 2011/0155348 A1    Jun. 30, 2011

(51) Int. Cl.
*G01R 31/00* (2006.01)
(52) U.S. Cl. ............... 324/750.03; 324/750.01
(58) Field of Classification Search .......... None
See application file for complete search history.

(56) References Cited

U.S. PATENT DOCUMENTS

| | | | | |
|---|---|---|---|---|
| 3,710,251 A | * | 1/1973 | Hagge et al. ............. | 324/750.08 |
| 5,684,669 A | * | 11/1997 | Collins et al. ................ | 361/234 |
| 5,754,391 A | * | 5/1998 | Bates ............................. | 361/234 |
| 7,595,468 B2 | | 9/2009 | Moon et al. ................... | 219/540 |
| 7,739,876 B2 | | 6/2010 | Gupta et al. ..................... | 62/3.2 |
| 7,742,299 B2 | | 6/2010 | Sauciuc et al. ................. | 361/695 |
| 7,982,478 B2 | | 7/2011 | Abazarnia et al. ........ | 324/754.04 |
| 2005/0111188 A1 | | 5/2005 | Bhattacharya et al. ........ | 361/699 |
| 2008/0002365 A1 | | 1/2008 | Gupta ........................... | 361/700 |
| 2008/0237843 A1 | | 10/2008 | Gupta et al. .................... | 257/713 |
| 2011/0109335 A1 | | 5/2011 | Schroeder et al. ........ | 324/750.08 |

FOREIGN PATENT DOCUMENTS

JP     08 037260    2/1996

* cited by examiner

*Primary Examiner* — Vinh Nguyen
(74) *Attorney, Agent, or Firm* — Konrad Raynes Davda & Victor LLP; Alan S. Raynes

(57) ABSTRACT

Systems and methods including testing of electronic components are described. One system relates to a system including a thermal control unit adapted to control the temperature of at least a portion of an electronic component during testing. The system includes at least one conduit extending through a portion of the thermal control unit, the conduit sized to permit the flow of a thermal interface material therethrough, the thermal interface material comprising a liquid. The at least one conduit is positioned so that the thermal interface material can be delivered through the conduit and onto the electronic component. The system also includes a device adapted to control the flow of the thermal interface material through the conduit, wherein the flow can be controlled to deliver the thermal interface material to the electronic component and to remove the thermal interface material from the electronic component. Other embodiments are described and claimed.

16 Claims, 4 Drawing Sheets

SYSTEM INCLUDING THERMAL CONTROL UNIT HAVING CONDUIT FOR DISPENSE AND REMOVAL OF LIQUID THERMAL INTERFACE MATERIAL

RELATED ART

Testing procedures for electronic components may utilize a thermal control unit having a temperature controlled surface for contacting the electronic component or components being tested. Certain configurations and testing procedures may utilize a thermal interface material between the thermal control unit and the electronic component. The thermal interface material may be a solid material or a liquid material.

Solid thermal interface materials have certain problems including stress being applied to the component because the solid-solid contact is not particularly compliant. In addition, solid thermal interface materials often do not provide the desired thermal resistance between the thermal control unit and the component being tested. In addition, the use of a solid thermal interface material often requires the use of hardware including clips and the like to hold the thermal interface material to the thermal control unit.

Liquid thermal interface materials have certain problems including difficulties in handling and application of the liquid and difficulties in removing the liquid from the component after testing. For example, a liquid thermal interface material is typically applied to the component to be tested prior to positioning the component into the test socket in the test location. Thus, an additional operation of applied the liquid thermal interface material prior to loading into the test location is needed. In addition, liquid thermal interface materials tend to evaporate over time during testing operations.

BRIEF DESCRIPTION OF THE DRAWINGS

Embodiments are described by way of example, with reference to the accompanying drawings, which are not necessarily drawn to scale, wherein:

FIG. 8($b$) illustrates a view of the textured surface of the pedestal of FIG. 7($a$), the textured surface including a plurality of grooves, in accordance with certain embodiments FIGS. 9($a$) through 9($d$) illustrate views of various configurations of a surface of a pedestal, in accordance with certain embodiments.

DETAILED DESCRIPTION

Certain embodiments relate to systems for testing components using a liquid thermal interface material. Embodiments relate to systems, the parts making up the system, and methods. In certain embodiments, the system includes a supply of a thermal interface material, a thermal control unit adapted to control the temperature of a component (for example, electronic device) to be tested, and a device for pumping the thermal interface material back and forth through the thermal control unit.

Figure 1:
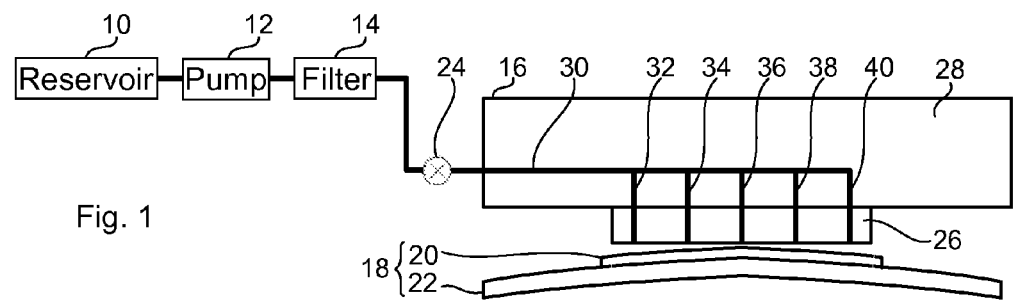
FIG. 1 illustrates a view of a system that can be used to test components using a liquid thermal interface material, in accordance with certain embodiments.

FIG. 1 illustrates a view of a system that can be used to test components such as electronic components using a liquid thermal interface material, in accordance with certain embodiments. The system may include a reservoir 10 that may contain a thermal interface material, a device such as a pump 12 to pump the thermal interface material through the system, and a filter 14 through which the thermal interface material may flow. A device for controlling the flow of the thermal interface material through the system may in certain embodiments include one or more pumps. As illustrated in FIG. 1, pump 12 may be any suitable pump to apply a force to transport a fluid through the system. The system also includes a thermal control unit 16 adapted to control the temperature of a component 18 to be tested. During certain testing procedures, a component or a portion thereof may be heated or cooled during electronic testing to simulate possible operating conditions. The component 18 may in certain embodiments be an electronic component such as an assembly including a semiconductor chip 20 containing integrated circuits that is positioned on a substrate 22. The component 18 may have a variety of shapes, including, but not limited to, a bowed shape or a flat shape. The bowed shape may be due to warping, and may be concave, convex, or have some more complex shape. The system of FIG. 1 also includes a valve 24 adapted to permit the flow of a liquid thermal interface material when opened. The thermal control unit 16 may be configured to include a pedestal 26 through which the heating and/or cooling of the component 18 is controlled. The pedestal 26 may be formed integral with the body portion 28 of the thermal control unit 16 or may be a separate component coupled thereto. As illustrated in FIG. 1, the body portion 28 is positioned above the pedestal portion. The pedestal 26 may be formed from a variety of materials, including, but not limited to, metals. In the configuration illustrated in FIG. 1, the component 18 is positioned directly beneath the pedestal 26. Other embodiments may orient the various components differently. The thermal control unit 16 as illustrated in FIG. 1 includes a conduit 30 extending through the body portion 28 and including a plurality of passages 32, 34, 36, 38, 40 extending through the pedestal 26. Tubing 15 (and associated seals, fittings, etc.) may be positioned between and within the various parts (e.g., reservoir 10, pump 12, filter 14, valve 24, and thermal control unit 16) illustrated in FIG. 1.

Figure 2:
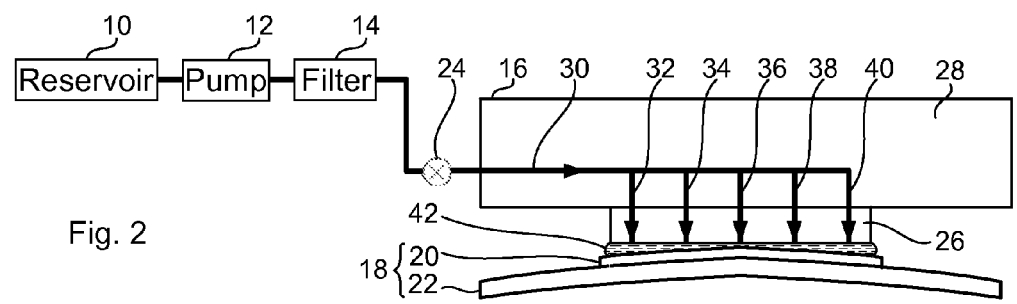
FIG. 2 illustrates a system including a liquid thermal interface material delivered through a thermal control unit and onto a component, in accordance with certain embodiments.

FIG. 2 shows the presence of a liquid thermal interface material 42. The liquid thermal interface material 42 is transmitted through the valve 24, through the conduit 30 and its passages 32, 34, 36, 38, 40 in the thermal control unit 16 and dispensed onto the component 18 to be tested. The direction of flow through the conduit 30 and its passages 32, 34, 36, 38, 40 to the component 18 is indicated by arrows in FIG. 2. The conduit 30 and its passages 32, 34, 36, 38, 40 in the thermal control unit 16 may comprise tubular shaped openings extending in and though the thermal control unit 16. Alternatively, in other embodiments, the conduit may take the form of one or more trenches a trench extending along a portion of the thermal control unit. In such an embodiment, one or more tubes may be positioned in the trench and the liquid thermal interface material distributed through the tube or tubes. Other suitable shapes and configurations for the conduit 30 are also possible. Embodiments may be controlled to provide for a fixed volume dispense or a variable volume dispense of the liquid thermal interface material, depending on, for example, the testing conditions (e.g., time, temperature).

After the liquid thermal interface material 42 is delivered to the component 18, a desired testing operation may commence. During testing, the temperature of the component 18 may be increased and decreased, depending on the testing procedures. It is possible that during the testing, an amount of the liquid thermal interface material 42 may evaporate. If a sufficient amount of evaporation occurs, an additional quantity of liquid thermal interface material 42 may be delivered to the component 18. If the rate of evaporation is known prior to the testing procedure, then the system may be controlled (e.g., programmed) to automatically deliver an additional quantity of the liquid thermal interface material 42 at particular times during the testing process. Such additional delivery of the liquid thermal interface material 42 may in certain embodiments be performed without stopping the test. Embodiments may also permit for the continuous flow of liquid thermal interface material 42 to the component 18 during the testing operation.

After the testing of the component 18 is completed, the liquid thermal interface material 42 may be removed by directing the liquid thermal interface material 42 through the thermal control unit 16. While in certain embodiments it may be possible to utilize the pump 10 that was used previously, the embodiment illustrated in FIG. 3 utilizes a second pump 11 (for example, a vacuum pump or other suitable pump or mechanism for applying a force to remove a fluid (which may include liquid and gas) from the system), to suction the liquid thermal interface material 42 through the thermal control unit 16 and into, for example, reservoir 17. The direction of flow is illustrated by the arrows in FIG. 3. The valve 24 may in certain embodiments be a three way valve that can be set to control the flow of the liquid thermal interface material to the desired location, depending on whether the liquid thermal interface material is being directed to the component 18 or directed away from the component 18.

Figure 4:
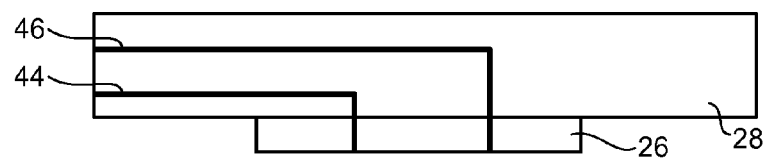
FIG. 4 illustrates a thermal control unit including a conduit through which a liquid thermal interface material may flow, in accordance with certain embodiments.

FIG. 4 illustrates a configuration in accordance with certain embodiments, including a plurality of conduits extending through the body portion 28 and the pedestal 26 of the thermal control unit 16. While FIG. 4 shows two conduits, including conduits 44, 46, embodiments may also include more than two conduits extending through the body portion 28 and pedestal 26 of the thermal control unit 16. An embodiment such as illustrated in FIG. 4 may be used in a procedure in which one conduit 44 is used to deliver the liquid thermal interface material to a component to be tested, and the other conduit 46 is used to remove the liquid thermal interface material from the component after testing.

Figure 5:
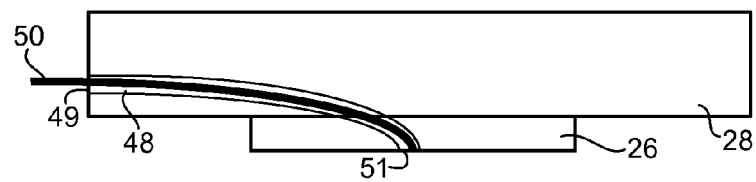
FIG. 5 illustrates a thermal control unit including a plurality of conduits through which a liquid thermal interface material may flow, in accordance with certain embodiments.

FIG. 5 illustrates a configuration in accordance with certain embodiments, including a conduit 48 extending through the body portion 26 and pedestal 26 of the thermal control unit, the conduit 48 sized to accept a tube 50 therein. The tube 50 may in certain embodiments comprise a needle that extends through the thermal control unit from the inlet/outlet 49 to the inlet/outlet 51 of the conduit 48. In an embodiment having one conduit such as conduit 48 of FIG. 5, during the dispensing of the liquid thermal interface material onto the component to be tested, the inlet/outlet 49 acts as an inlet and the inlet/outlet 51 acts as an outlet. During the removal of the liquid thermal interface material from the component after testing, the inlet/outlet 51 acts as an inlet, and the inlet/outlet 49 acts as an outlet. The use of a needle may permit more precise distribution of the liquid thermal interface material. A tube similar to the tube 50 may also be utilized within some or all of the conduits shown in the other figures, if desired.

Figure 6:
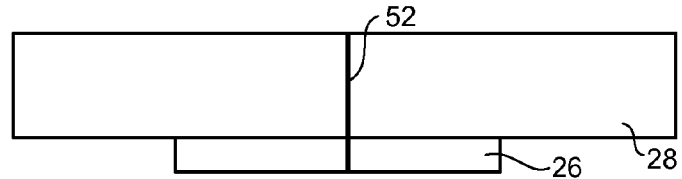
FIG. 6 illustrates a thermal control unit including a conduit sized to accept a tube through which a liquid thermal interface material may flow, in accordance with certain embodiments.

FIG. 6 illustrates a configuration in accordance with certain embodiments, including a conduit 52 extending through the body portion 28 and pedestal 26 of the thermal control unit. It should be noted that the various conduits illustrated in the Figures may be curved or straight. For example, the conduit 52 in FIG. 6 includes one straight region. The conduits 46, 48 illustrated in FIG. 4 include two straight regions and include a bend or turn between the straight regions. Alternatively, the conduit 48 illustrated in FIG. 5 is curved.

Figure 3:
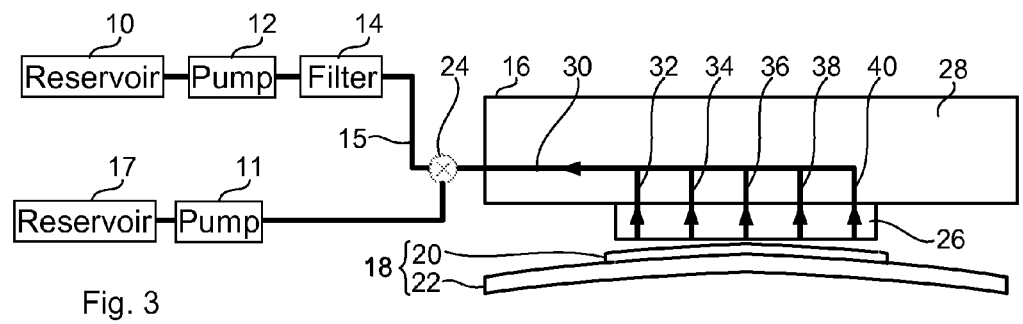
FIG. 3 illustrates a system after removing the liquid thermal interface material from a component after testing, through a thermal control unit, in accordance with certain embodiments.
Figure 7:
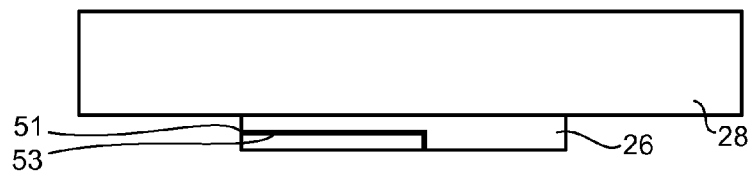
FIG. 7 illustrates a thermal control unit including a conduit extending though a pedestal portion of a thermal control unit, in accordance with certain embodiments.

FIG. 7 illustrates a configuration in accordance with certain embodiments, including a conduit 53 extending through the pedestal 26 of the thermal control unit. It should be noted that the conduit 53 may be sized to accept a tube at connection region 51 of the conduit at the edge of the pedestal 26. Such a tube may in turn be coupled to a valve and other components such as illustrated in FIG. 3 (e.g., tubing 15 coupled to the various components), for example.

Figure 8A:
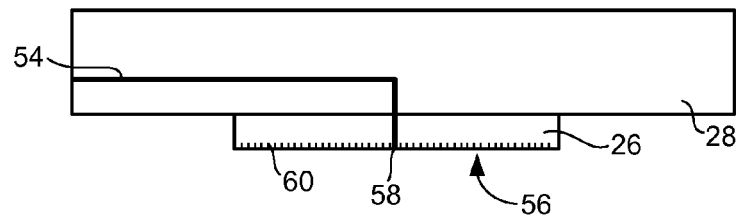
FIG. 8($a$) illustrates a thermal control unit including a conduit through which a liquid thermal interface material may flow, including a pedestal having a textured surface adapted to permit the flow of liquid thermal interface material therethrough, in accordance with certain embodiments.
Figure 8B:
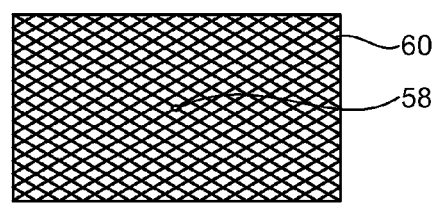

FIG. 8(a) illustrates a configuration in accordance with certain embodiments, including a single conduit 54 that extends through the body portion 28 and the pedestal 26 of the thermal control unit 16. The pedestal 26 includes a surface 56 that faces the component to be tested. The surface 56 also includes an opening 58 at the intersection of the conduit 54 and the surface 56. In operation, the liquid thermal interface material will flow through the opening 58 and onto the component to be tested. The opening 58 acts as an inlet or outlet depending on the direction of flow of the liquid thermal interface material. The surface 56 includes a textured structure of grooves 60 thereon. The grooves 60 extend into the pedestal 26 and may have a variety of patterns. The grooves act to speed the flow and improve the coverage of the liquid thermal interface material on the surface of the component being tested, and also and speed the removal of the liquid thermal interface material from the surface of the component. The grooves may vary in size and width depending on, for example, the materials being used. In certain embodiments, the grooves may be about 100 microns in depth and about 100 microns in width. Grooves may be incorporated into a variety of pedestal structures, including pedestals having one or more conduit openings, and pedestals having no conduit openings. FIG. 8(b) illustrates a view of the surface 56 of the pedestal 26, showing the grooves 60 thereon. In this embodiment, the grooves 60 are configured in a criss-cross pattern, and the opening 58 of the conduit 54 is located in the center of the surface 56. The positioning of the grooves may also be varied on the pedestal surface, due to factors including, but not limited to, the size of the component and its layout.

Figure 9A:
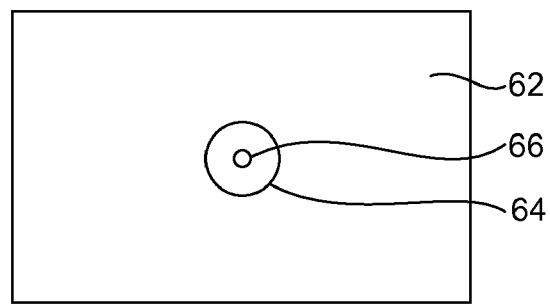
Figure 9B:
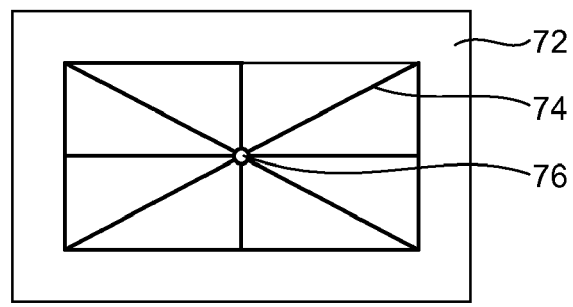

FIGS. 9(a) though 9(d) illustrate various configurations for a pedestal surface, in accordance with certain embodiments. FIG. 9(a) illustrates a pedestal surface 62, in which a circular shaped region 64 has been carved out from the pedestal. An opening 66 (inlet/outlet) through which a liquid thermal interface material may flow is positioned in the center of the circular shaped region 64. FIG. 9(b) illustrates a pedestal surface 72, in which a plurality of grooves 74 are formed in a pattern including a rectangular outline with grooves connecting the corners of the rectangle and grooves extending between opposite side center points of the rectangle. An opening 76 (inlet/outlet) through which the liquid thermal interface material may flow is positioned in the center of the rectangle.

Figure 9C:
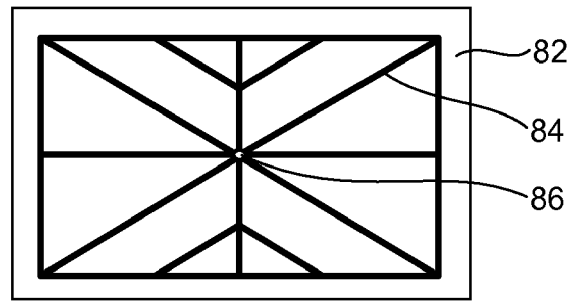
Figure 9D:
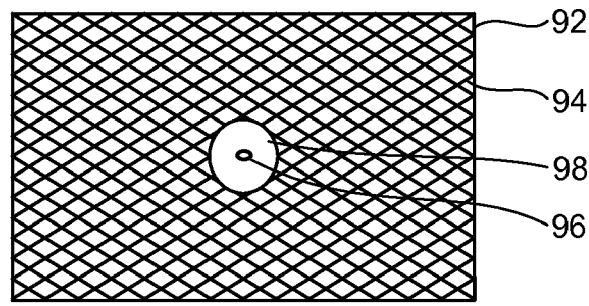

FIG. 9(c) includes a pedestal surface 82, in which a plurality of grooves 84 are formed in a pattern similar to that of FIG. 9(b), with additional grooves formed parallel to the grooves connecting the corners of the rectangle in certain selected regions of the surface. An opening 86 (inlet/outlet) through which the liquid thermal interface material may flow is positioned in the center of the rectangle. FIG. 9(d) includes a pedestal surface 92, in which a plurality of grooves 94 are formed in a criss-cross pattern similar to that of FIG. 8(b), with a circular shaped region 98 carved out from a central portion of the surface 92. An opening 96 (inlet/outlet) through which the liquid thermal interface material may flow is positioned in the center of the surface 92. The shape of the opening in the pedestal surface through which the liquid thermal interface material flows may be varied, and include a variety of shapes. For example, FIG. 9(a) illustrates opening 66 that is round, and FIG. 9(d) illustrates an opening 96 that is not round but is oval. Other shapes are also possible.

Figure 10:
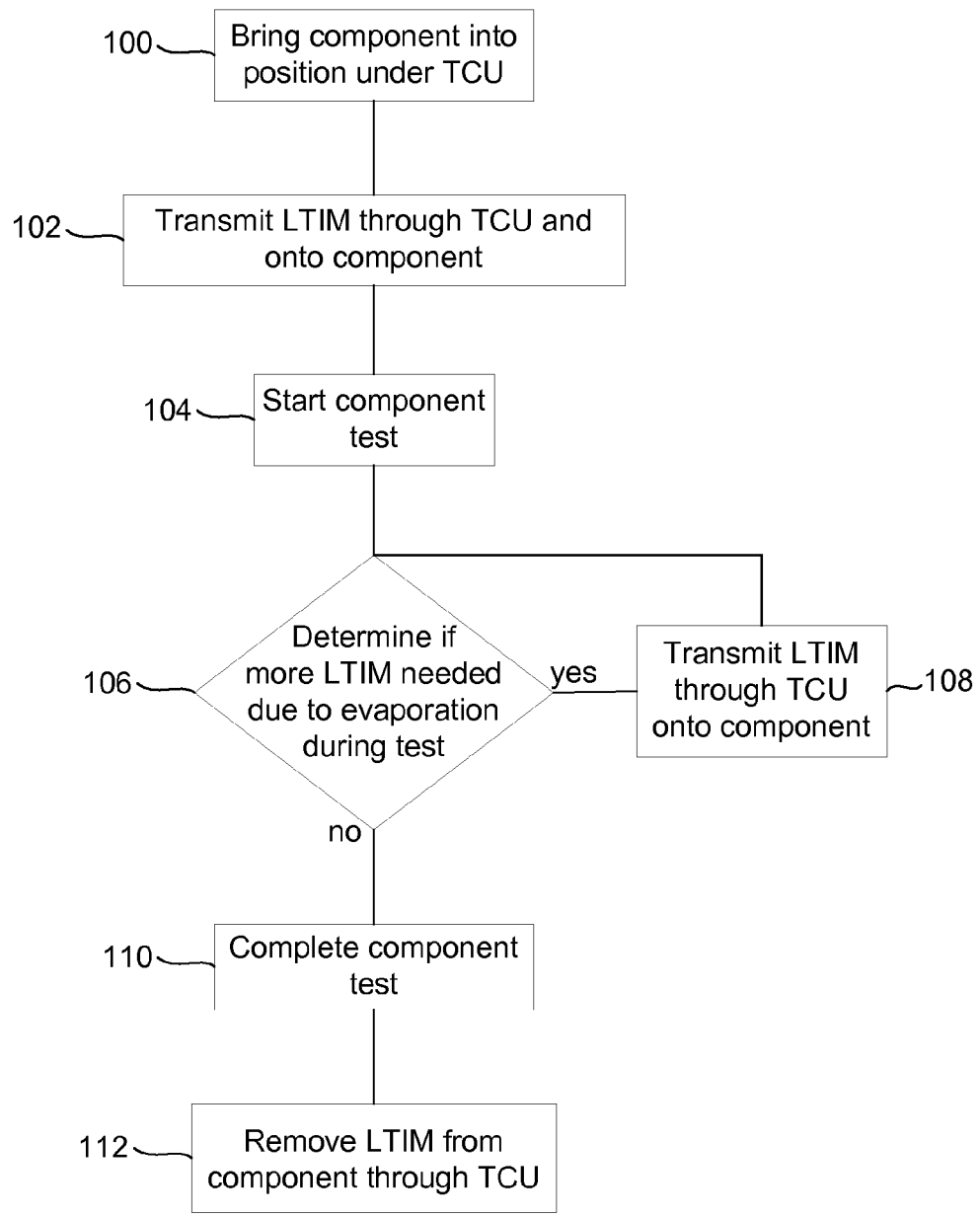
FIG. 10 illustrates a flow chart of operations including transmitting a liquid thermal interface material to a surface of a component and testing the component, in accordance with certain embodiments.

FIG. 10 illustrates a flow chart of operations for performing component testing in accordance with certain embodiments. Box 100 is bringing a component (for example, an electronic device assembly including a chip on a substrate) into position under a thermal control unit (TCU). In certain embodiments, it may be possible to utilize the system as a pick and placed device, with the pump and opening(s) on the pedestal acting in a manner to apply a sufficient suction force to pick up the component to be tested and hold it against the pedestal. Box 102 is transmitting a liquid thermal interface material (LTIM) through the thermal control unit and onto the component. In certain embodiments, this may take place after the component is in a test socket. Box 104 is starting the component test. Box 106 is determining if more liquid thermal interface material is needed on the component, due to evaporation during the test. Such a determination may, for example, be known from previous data or may be determined in real time using a sensor. If the answer is no, then Box 110 is completing the component test. If the answer is yes, then Box 108 is transmitting additional liquid thermal interface material through the thermal control unit onto the component. Then Box 110 is completing the component test. Box 112 is removing the liquid thermal interface material from the component through the thermal control unit. This may be carried out using a pump to suction the material as described, for example, in connection with FIG. 3. Various operations may be modified. For example, the determination of whether more liquid thermal interface material is needed may be carried out several times at set points during the operation, or may be carried out on a real time, continuous basis.

Certain embodiments may be used for testing procedures that last for a relatively long time, for example, test times ranging from seconds or up to 40 minutes or longer. Embodiments may be used for testing a wide variety of components, including, but not limited to, those components that fit into a test socket. Examples of components that may be tested in accordance with certain embodiments include, but are not limited to, CPU's/processors, chipsets, graphics devices, wireless devices, multi-chip and three dimensional packages, memory, and various boards. For semiconductor die components, embodiments may be used in connection with bare die and lidded components.

The various embodiments described herein may provide one or more of the following advantages in operation. First, the system may permit improved handling of the liquid thermal interface material during testing, because the system can automatically add more material without the need to stop the test and separate the thermal control unit from the component being tested in order to add more material. Second, the same system may be used to deliver and remove the liquid thermal interface material from the component, which reduces the equipment needed. Third, certain embodiments may provide for the removal of all or substantially all of the liquid thermal interface material remaining on the component after testing, without the need for a separate cleaning operation to remove the liquid thermal interface material. Fourth, the system permits the use of a liquid thermal interface material for longer time tests, which reduces die cracking and staining, which occur more frequently during tests performed with a solid thermal interface material. Fifth, certain embodiments may permit the thermal control unit system to be used as a pick and place device, thus improving the efficiency of the overall processing system as less equipment is needed to carry out the testing.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art. For example, certain embodiments may permit both the continuous delivery and removal of liquid thermal interface material to the component being tested, in order to ensure that a desirable amount is present while at the same time removing any excess liquid thermal interface material.

What is claimed:

1. A system comprising:
   a thermal control unit adapted to control the temperature of at least a portion of an electronic component during testing;
   at least one conduit extending through a portion of the thermal control unit, the conduit sized to permit the flow of a thermal interface material therethrough, the thermal interface material comprising a liquid; and
   a device adapted to control the flow of the thermal interface material through the at least one conduit, wherein the flow can be controlled to deliver the thermal interface material to the electronic component and to remove a quantity of the thermal interface material from the electronic component.

2. The system of claim 1, wherein the device includes a first pump and a second pump, the first pump adapted to transmit the dispense the liquid thermal interface material onto the electronic component, the second pump adapted to remove the quantity of the liquid thermal interface material from the electronic component.

3. The system of claim 2, wherein the at least one conduit includes at least a first conduit and a second conduit, the first conduit in communication with the first pump, and the second conduit in communication with the second pump.

4. The system of claim 1, wherein the device includes a single pump adapted to dispense the liquid thermal interface material onto the electronic component and to remove the quantity of the liquid thermal interface material from the electronic component.

5. The system of claim 1, the thermal control unit including a surface adapted to make thermal contact with the electronic component, the surface including a plurality of grooves therein.

6. The system of claim 1, further comprising a supply of thermal interface material in fluid connection with the at least one conduit.

7. The system of claim 1, wherein the thermal control unit includes a pedestal, the pedestal including a surface adapted to make thermal contact with the electronic component, the surface including a plurality of openings through which the liquid thermal interface material may flow.

8. The system of claim 1, wherein the thermal control unit includes a pedestal through which the liquid thermal interface material may flow, the pedestal including a surface adapted to make thermal contact with the electronic component, the surface including a plurality of grooves therein.

9. The system of claim 8, wherein the plurality of grooves are in a criss-cross pattern.

10. The system of claim 1, wherein the flow is controlled to deliver the thermal interface material to the electronic component through the at least one conduit and to remove the quantity of the thermal interface material from the electronic component through the at least one conduit.

11. A method comprising:
   delivering a liquid thermal interface material through a thermal control unit and onto an electronic component, the thermal control unit including at least one conduit through which the liquid thermal interface material may flow;
   performing a test operation of the electronic component having the thermal interface material thereon;
   sensing an amount of evaporation of liquid thermal interface material during the test operation and then delivering additional liquid thermal interface material through the thermal control unit to the electronic component during the test operation; and
   after the performing a test operation, removing at least a portion of the liquid thermal interface material from the electronic component through the thermal control unit.

12. The method of claim 11, wherein the at least one conduit includes at least a first conduit and a second conduit, wherein the delivering the liquid thermal interface material onto the electronic component is carried out through the first conduit, and wherein the removing at least a portion of the liquid thermal interface material is carried out through the second conduit.

13. The method of claim 11, the thermal control unit including a surface adapted to make thermal contact with the electronic component, the surface including a plurality of grooves therein, further comprising transmitting the thermal interface material along the grooves in the surface.

14. The method of claim 11, further comprising a pump, wherein the delivering the thermal interface material and the removing at least a portion of the thermal interface material are carried out using the pump.

15. The method of claim 11, further comprising delivering additional liquid thermal interface material through the thermal control unit to the device during the test operation, when an amount of the liquid thermal interface material has evaporated during the test operation.

16. The method of claim 11, wherein the at least one conduit includes a first conduit, wherein the delivering the liquid thermal interface material and the removing at least a portion of the liquid thermal interface material are both carried out through the first conduit.

* * * * *